(12) United States Patent
Lopez et al.

(10) Patent No.: US 9,935,041 B1
(45) Date of Patent: Apr. 3, 2018

(54) MULTI-CHIP MODULE CLIPS WITH CONNECTOR BAR

(71) Applicant: Texas Instruments Incorporated, Dallas, TX (US)

(72) Inventors: Osvaldo Jorge Lopez, Annandale, NJ (US); Jonathan Almeria Noquil, Bethlehem, PA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/480,999

(22) Filed: Apr. 6, 2017

(51) Int. Cl.
*H01L 23/495* (2006.01)
*H01L 23/525* (2006.01)
*H01L 21/48* (2006.01)
*H01L 23/00* (2006.01)
*H01L 23/29* (2006.01)
(Continued)

(52) U.S. Cl.
CPC .... *H01L 23/49575* (2013.01); *H01L 21/4825* (2013.01); *H01L 21/4842* (2013.01); *H01L 23/293* (2013.01); *H01L 23/3114* (2013.01); *H01L 23/49541* (2013.01); *H01L 23/49572* (2013.01); *H01L 23/49582* (2013.01); *H01L 24/32* (2013.01); *H01L 24/40* (2013.01); *H01L 24/83* (2013.01); *H01L 24/84* (2013.01); *H01L 24/97* (2013.01); *H01L 25/18* (2013.01); *H01L 25/50* (2013.01); *H01L 2224/32245* (2013.01); *H01L 2224/37147* (2013.01); *H01L 2224/40257* (2013.01); *H01L 2224/83191* (2013.01); *H01L 2924/1304* (2013.01); *H01L 2924/14* (2013.01)

(58) Field of Classification Search
CPC ............... H01L 24/83; H01L 23/49541; H01L 23/49551; H01L 23/49503; H01L 23/49548; H01L 23/49572; H01L 23/49565; H01L 23/49575; H01L 2224/37147; H01L 2224/32245; H01L 2224/83191; H01L 2224/40245; H01L 24/84; H01L 24/97; H01L 23/3114; H01L 24/40; H01L 23/495; H01L 2924/14; H01L 25/18; H01L 23/49582; H01L 24/32; H01L 25/50
See application file for complete search history.

(56) References Cited

U.S. PATENT DOCUMENTS 9,171,788 B1 10/2015 Xue et al.
9,472,491 B2 3/2016 Xue et al.
(Continued)

*Primary Examiner* — Jasmine Clark
(74) *Attorney, Agent, or Firm* — Jacqueline J. Garner; Charles A. Brill; Frank D. Cimino

(57) ABSTRACT

A clip tape includes connected clip sets; each includes a first clip and a second clip oriented in a same direction, connected by a connector bar. A first multi-chip module and a second multi-chip module are formed by providing a lead frame array containing lead frame units, and providing a clip tape containing connected clip sets. A connected clip set is separated from the clip tape as a unit and placed on the lead frame array; the first clip in the first multi-chip module, and the second clip in the second multi-chip module. The connector bar remains attached during a heating operation, and is severed by a singulation process. A multi-chip module includes a lead frame unit, a semiconductor device, and a clip of a connected clip set attached to the semiconductor device. A connector bar extends from the clip to an external surface of the multi-chip module.

11 Claims, 9 Drawing Sheets

(51) Int. Cl.
    *H01L 23/31*     (2006.01)
    *H01L 25/18*     (2006.01)
    *H01L 25/00*     (2006.01)

(56) References Cited

U.S. PATENT DOCUMENTS

| | | | | |
|---|---|---|---|---|
| 2005/0189626 A1* | 9/2005 | Xiaochun | ......... | H01L 23/49562 257/666 |
| 2009/0039484 A1* | 2/2009 | Mahler | ............ | H01L 23/49524 257/676 |
| 2012/0313232 A1* | 12/2012 | Zhang | ................... | H01L 21/565 257/676 |

\* cited by examiner

US 9,935,041 B1

MULTI-CHIP MODULE CLIPS WITH CONNECTOR BAR

FIELD OF THE DISCLOSURE

This disclosure relates to the field of multi-chip modules. More particularly, this invention relates to clips in multi-chip modules.

BACKGROUND OF THE DISCLOSURE

A stacked multi-chip module includes semiconductor devices such as two or more discrete transistors and a control integrated circuit, in a stacked configuration, on a lead frame unit. The lead frame unit is part of a lead frame array which has a plurality of multi-chip module sites. One or more clips make electrical connections between the semiconductor devices and pins of the lead frame. The clips are typically copper foil that has been stamped into the desired shape. The clips are separated from a clip tape and placed onto the multi-chip module sites. The clips are electrically coupled to the semiconductor devices by solder, which is reflowed during assembly of the multi-chip module. During solder reflow, single clips may rotate and/or tilt, leading to defects in the multi-chip module such as solder extending beyond the clips and causing a short circuit, and/or insufficient solder between the clip and the corresponding semiconductor device.

This problem has been addressed by using gang clips which have a clip for each multi-chip module site of the lead frame array. The clips in the gang clip are linked together by tie bars. Gang clips, usually produced by masking and etching operations, are more costly than clip tapes. Furthermore, gang clips commonly have several tie bars per clip, which are severed during singulation of the lead frame array, undesirably increasing wear on the saw blade used for singulation.

This problem has also been addressed by the invention described in U.S. Pat. Nos. 9,472,491 and 9,171,788. These patents describe a lead frame with adjacent lead frame units that are rotated 180 degrees with respect to each other, and a corresponding first and second clip sets that are likewise rotated 180 degrees with respect to each other. Lead frames with lead frame units that are rotated 180 degrees, being nonstandard, add cost and complexity to the multi-chip module assembly process. Moreover, die placed on the rotated lead frame units must be rotated during pick and place operations, further adding to cost and cycle time. Furthermore, it is not always feasible to have adjacent lead frame units that are rotated 180 degrees with respect to each other, due to placement of the clip contacts. The clip contact areas depicted in U.S. Pat. Nos. 9,472,491 and 9,171,788 consume more space than commonly used clip feet.

SUMMARY OF THE DISCLOSURE

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

A clip tape includes connected clip sets, wherein each connected clip set includes a first clip and a second clip. The first clip and the second clip are connected to each other by a connector bar which does not extend to a tape frame of the clip tape. The first clip and the second clip are attached to the tape frame by tie bars. The first clip and the second clip are oriented in a same direction.

A first multi-chip module and a second multi-chip module are formed by providing a lead frame array containing a plurality of lead frame units, all oriented in a same direction. A plurality of semiconductor devices is provided. A separate semiconductor device from the plurality of semiconductor devices is attached to each lead frame unit. An electrically conductive attachment material, such as solder paste, solder preforms, or electrically conductive adhesive, is disposed onto each semiconductor device attached to the lead frame units. A clip tape containing a plurality of connected clip sets is provided. Each connected clip set includes a first clip and a second clip, oriented in a same direction and connected by a connector bar. A first connected clip set of the plurality of connected clip sets is separated from the clip tape. The first clip, the second clip, and the connector bar of the first connected clip set are separated from the clip tape as a unit. The first connected clip set is placed on the lead frame array, so that the first clip is placed on the attachment material on a first semiconductor device of the first multi-chip module, and the second clip is placed on the attachment material on a second semiconductor device of the second multi-chip module, so that the connector bar remains attached to the first clip and the second clip. The lead frame array with the connected clip set subsequently undergoes a heating operation, which may be a solder reflow operation and/or an adhesive curing operation, during which the connector bar holds the first clip and the second clip in desired positions on the first multi-chip module site and the second multi-chip module site, respectively. The first multi-chip module and the second multi-chip module are subsequently separated by a singulation process that severs the connector bar.

A multi-chip module includes a lead frame unit, a semiconductor device attached to the lead frame unit, and a clip of a connected clip set electrically coupled to the semiconductor device by electrically conductive attachment material. The multi-chip module includes packaging material surrounding the semiconductor device. A tie bar extends from the clip; the tie bar does not extend to an external surface of the packaging material. A connector bar extends from the clip to the external surface of the packaging material.

DETAILED DESCRIPTION OF EXAMPLE EMBODIMENTS

Figure 1A:
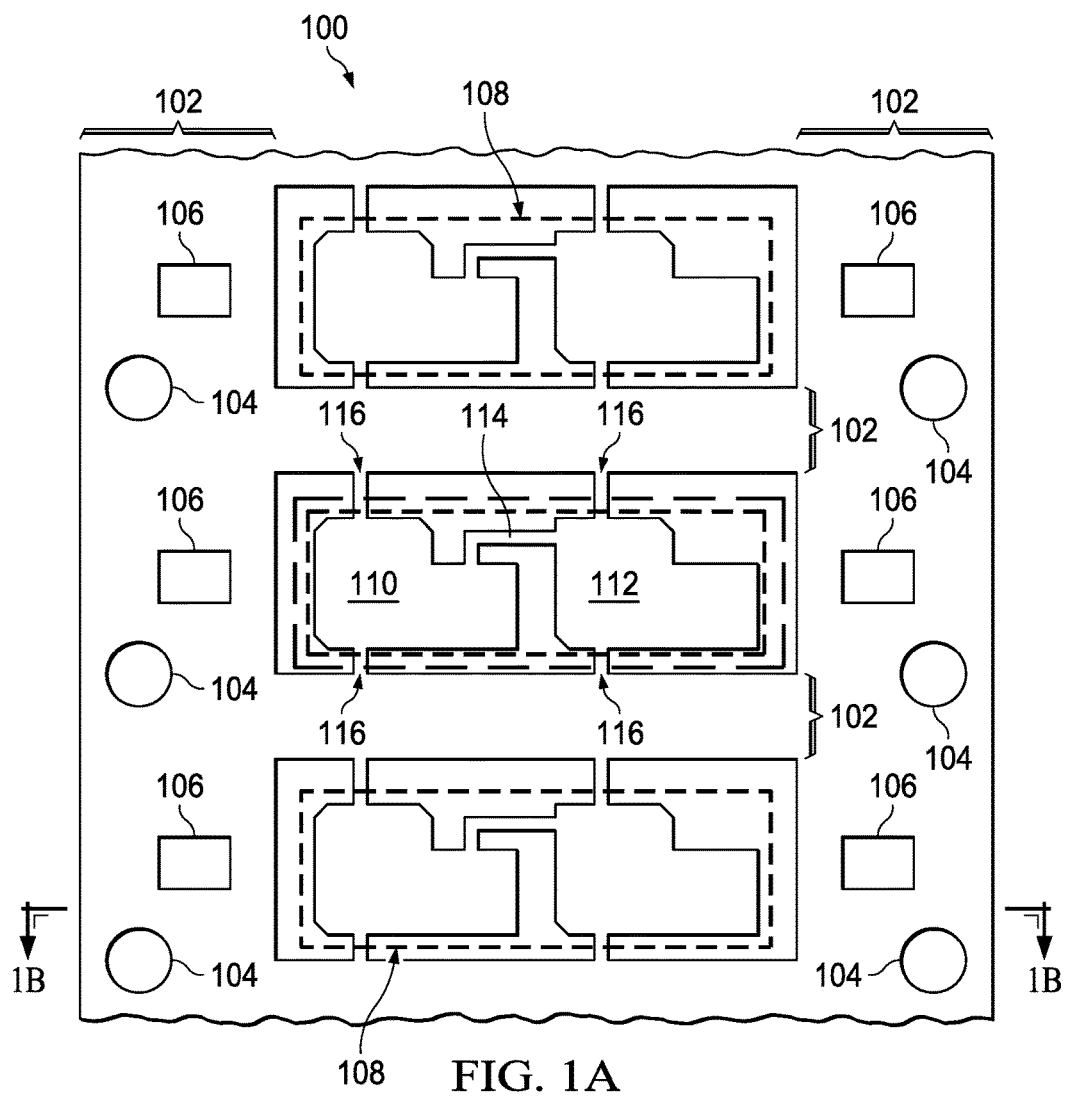
FIG. 1A and FIG. 1B depict an example clip tape containing connected clip sets.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In one aspect of the instant disclosure, a clip tape includes a plurality of connected clip sets. Each connected clip set includes a first clip and a second clip, connected to each other by a connector bar. Each connected clip set is laterally surrounded by a tape frame of the clip tape. The connector bar does not extend to the tape frame. The first clip and the second clip are attached to the tape frame by tie bars. The first clip and the second clip are oriented in a same direction.

In another aspect of the instant disclosure, a first multi-chip module and a second multi-chip module are formed. A lead frame array is provided; the lead frame array contains a plurality of lead frame units, all oriented in a same direction. A plurality of semiconductor devices is provided, and a separate semiconductor device from the plurality of semiconductor devices is attached to each lead frame unit. Having the lead frame units oriented in the same direction simplifies placement of the semiconductor devices compared to a lead frame array with lead frame units oriented in different directions, necessitating rotation of at least a portion of the semiconductor devices before placement. Attachment material is disposed onto each semiconductor device. A clip tape containing a plurality of connected clip sets, as described above, is provided. A first connected clip set of the plurality of connected clip sets is separated from the clip tape as a unit, and is placed on the lead frame array, the first clip being placed on the attachment material in the first multi-chip module, and the second clip is placed on the attachment material in the second multi-chip module, so that the connector bar remains attached to the first clip and the second clip. The lead frame array subsequently undergoes a heating operation, which may be a solder reflow operation and/or an adhesive curing operation, during which the connector bar holds the first clip and the second clip in desired positions. The heating operation causes the attachment material to form an electrical connection to the first clip and the second clip. In the case in which the attachment material is manifested as solder paste or solder preforms, the electrical connection is a soldered connection. In the case in which the attachment material is manifested as conductive adhesive, the electrical connection is an electrically conductive adhesive connection. It is recognized that a form of electrical connection may exist between the attachment material and the first and second clips before the heating operation, provided by physical contact between the first and second clips and the attachment material. For the purposes of this disclosure, it will be understood that the term "electrical connection' is used to describe a permanent, durable electrical connection provided by reflowed solder of cured electrically conductive adhesive, or such. The first multi-chip module and the second multi-chip module are subsequently separated by a singulation process that severs the connector bar.

A multi-chip module includes a lead frame unit, a semiconductor device attached to the lead frame unit, and a clip of a connected clip set electrically coupled to the semiconductor device by an electrically conductive attachment material such as solder or electrically conductive adhesive. The multi-chip module includes packaging material, for example encapsulation polymer, surrounding the semiconductor device. A tie bar extends from the clip; the tie bar does not extend to an external surface of the packaging material. A connector bar extends from the clip to the external surface of the packaging material.

Figure 1B:
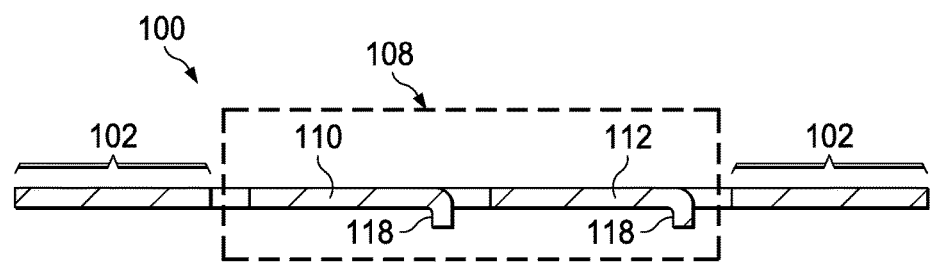

FIG. 1A and FIG. 1B depict an example clip tape containing connected clip sets. Referring to FIG. 1A, the clip tape 100 has a tape frame 102 which extends along sides of the clip tape 100. Sprocket holes 104 and/or registration apertures 106 may be located in the tape frame 102. The clip tape 100 includes a plurality of connected clip sets 108, separated by portions of the tape frame 102. Each connected clip set 108 includes a first clip 110 and a second clip 112 oriented in a same direction as the first clip 110, connected by a connector bar 114. The connector bar 114 does not extend to the tape frame 102. Tie bars 116 connect the first clip 110 and the second clip 112 to the tape frame 102.

The clip tape 100 may be stamped from a metal foil, such as a copper foil, so that the tape frame 102, the first clips 110, the second clips 112, the connector bars 114 and the tie bars 116 have substantially equal thicknesses and compositions. In the context of the instant disclosure, the term "substantially equal" may be understood to include instances of the tape frame 102, the first clips 110, the second clips 112, the connector bars 114 and the tie bars 116 which have thickness which are equal within the normal variations of thickness encountered in the processes used to fabricate the clip tape 100, for example a few micrometers. The metal foil may have a thickness of 0.10 millimeters to 0.15 millimeters, which has been demonstrated to provide a desired low electrical resistance for the first clips 110, the second clips 112. The connector bars 114 may have a width of 0.20 millimeters to 0.30 millimeters, which has been demonstrated to provide a desired level of mechanical support for the first clips 110, the second clips 112, while causing an acceptable level of wear on saw blades used for singulation. Furthermore, each connected clip set 108 may have exactly one connector bar 114 connecting each first clip 110 to each corresponding second clip 112, which may reduce wear on the saw blades compared to multiple connector bars per connected clip set.

FIG. 1B is a cross section of the clip tape 100 along the section line A-A shown in FIG. 1A. Each first clip 110 and each second clip 112 may have a contact foot 118 extending out of the plane of the clip tape 100. The contact foot 118 may make an electrical connection to pins of a lead frame in a multi-chip module containing the corresponding first clip 110 or second clip 112. The contact tabs 118 may be formed by a coining process.

Figure 2A:
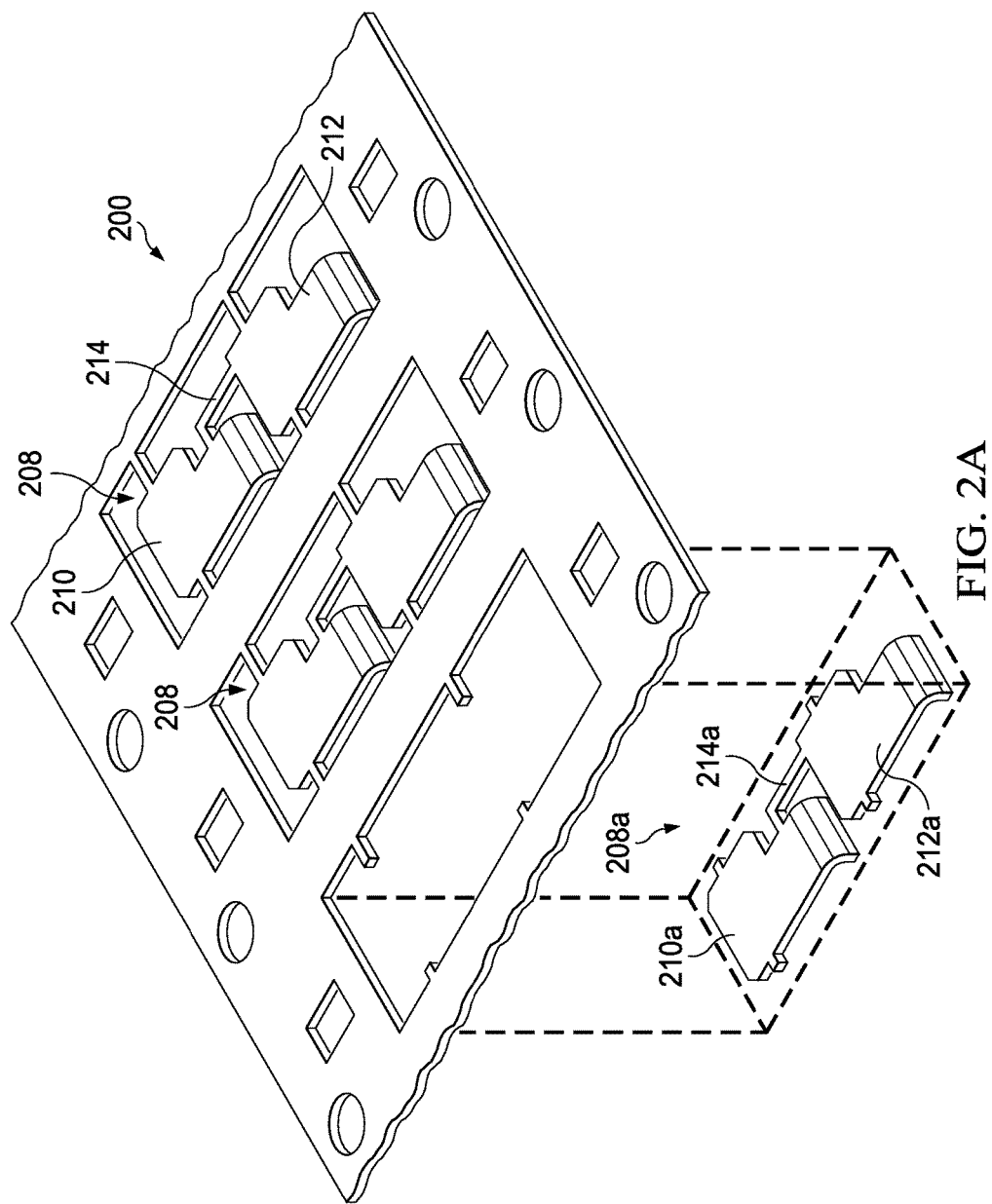
FIG. 2A through FIG. 2D depict an example method of forming a first multi-chip module and a second multi-chip module.

FIG. 2A through FIG. 2D depict an example method of forming a first multi-chip module and a second multi-chip module. Referring to FIG. 2A, a clip tape 200 containing a plurality of connected clip sets 208 is provided. Each connected clip set 208 includes a first clip 210 and a second clip 212 connected to each other by a connector bar 214, as described in reference to the clip tape 100 of FIG. 1A and FIG. 1B. A first connected clip set 208*a* is separated from the clip tape 200, for example by a punch process. The first connected clip set 208*a* is separated as a unit, so that a first clip 210*a* and a second clip 212*a* of the first connected clip set 208a remain connected to each other by a connector bar 214a after the first connected clip set 208a is separated from the clip tape 200.

Figure 2B:
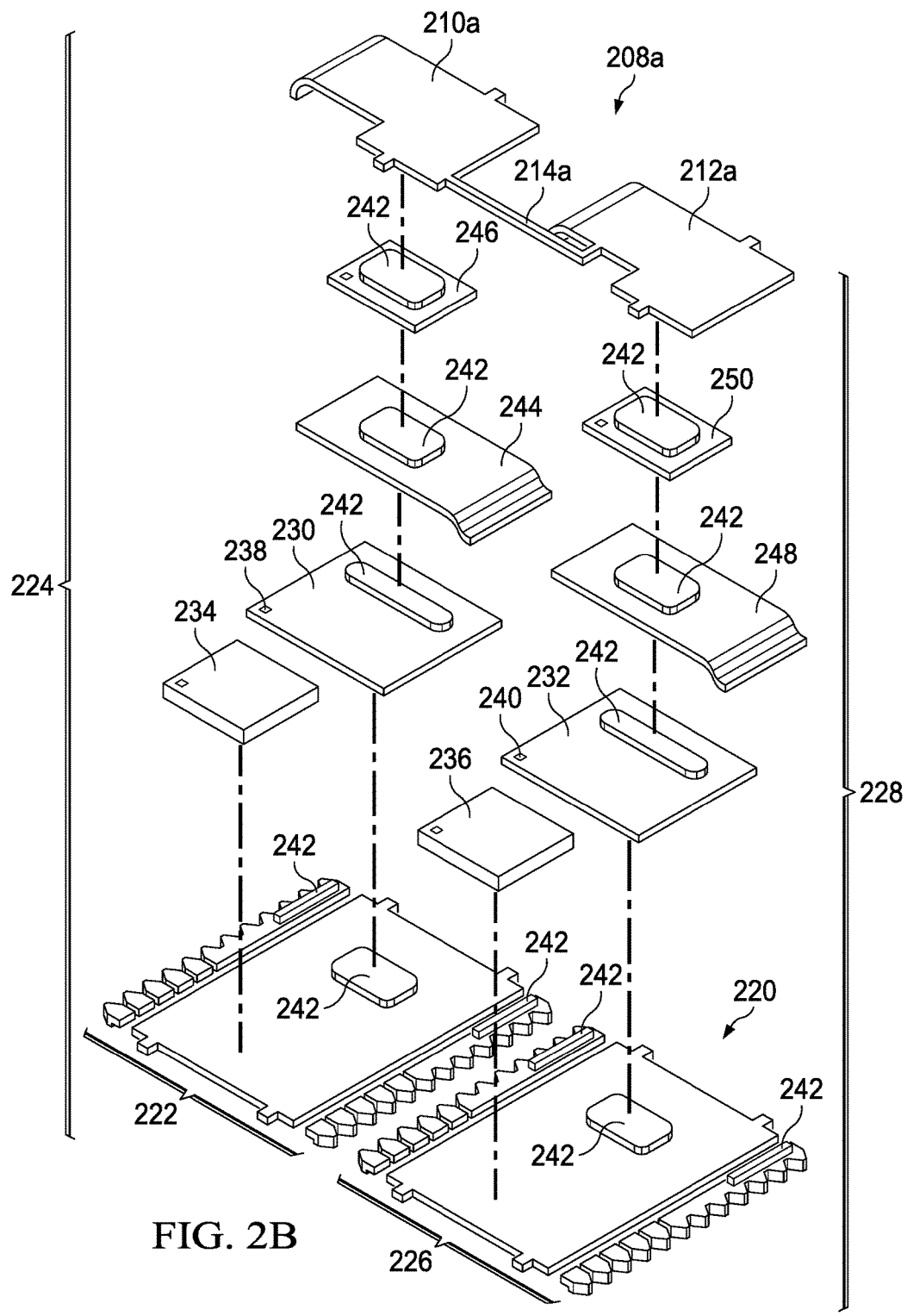

Referring to FIG. 2B, a lead frame array 220 is provided. The lead frame array 220 includes a plurality of lead frame units, including a first lead frame unit 222, of the first multi-chip module 224, and a second lead frame unit 226, of the second multi-chip module 228. The lead frame units of the lead frame array 220, including the first lead frame unit 222 and the second lead frame unit 226, are oriented in a same direction.

Attachment material 242 is disposed onto the lead frame array 220, including a first portion of the attachment material 242 on the first lead frame unit 222 and a second portion of the attachment material 242 on the second lead frame unit 226. The attachment material 242 may include, for example, solder paste, solder preforms or electrically conductive adhesive. Solder paste in the attachment material 242 may be disposed by a dispensing operation. Solder preforms in the attachment material 242 may be disposed by a pick-and-place operation. Electrically conductive adhesive in the attachment material 242 may be disposed by a dispensing operation. Additional portions of the attachment material 242 may also be disposed on the first lead frame unit 222 and on the second lead frame unit 226 in areas for subsequently-formed connections to clips of the first multi-chip module 224 and the second multi-chip module 228, respectively.

Semiconductor devices are placed on the lead frame units, including a first semiconductor device 230 placed on the first portion of the attachment material 242 on the first lead frame unit 222, and a second semiconductor device 232 placed on the second portion of the attachment material 242 on the second lead frame unit 226. The semiconductor devices may also include a third semiconductor device 234 placed on the first lead frame unit 222 and a fourth semiconductor device 236 placed on the second lead frame unit 226. The third semiconductor device 234 and the fourth semiconductor device 236 may be a different device type than the first semiconductor device 230 and the second semiconductor device 232. For example, the first semiconductor device 230 and the second semiconductor device 232 may be discrete power transistors, and the third semiconductor device 234 and the fourth semiconductor device 236 may be control integrated circuits. The first semiconductor device 230 and the second semiconductor device 232 are oriented in a same direction, as indicated in FIG. 2B by relative positions of a first reference mark 238 and a second reference mark 240. Similarly, the third semiconductor device 234 and the fourth semiconductor device 236 are oriented in a same direction. The first semiconductor device 230, the second semiconductor device 232, the third semiconductor device 234, and the fourth semiconductor device 236, may be placed by a pick-and-place operation.

A third portion of the attachment material 242 is disposed on the first semiconductor device 230 and a fourth portion of the attachment material 242 is disposed on the second semiconductor device 232. The third portion and the fourth portion of the attachment material 242 may have similar compositions to the first portion and the second portion of the attachment material 242, or may have different compositions. In one version of the instant example, the first portion and the second portion of the attachment material 242 may comprise solder preforms while the third portion and the fourth portion of the attachment material 242 may comprise solder paste.

A first discrete clip 244 is disposed onto the first portion of the attachment material 242 on the first semiconductor device 230. The first discrete clip 244 may also make contact with the first portion of the attachment material 242 on the first lead frame unit 222. A second discrete clip 248 is disposed onto the second portion of the attachment material 242 on the second semiconductor device 232. The second discrete clip 248 may also make contact with the attachment material 242 on the second lead frame unit 226. A fifth portion of the attachment material 242 is disposed on the first discrete clip 244, and a sixth portion of the attachment material 242 is disposed on the second discrete clip 248.

A fifth semiconductor device 246 is placed on the fifth portion of the attachment material 242 on the first discrete clip 244, and a sixth semiconductor device 250 is placed on the sixth portion of the attachment material 242 on the second discrete clip 248. A seventh portion of the attachment material 242 is disposed on the fifth semiconductor device 246 and an eighth portion of the attachment material 242 is disposed on the sixth semiconductor device 250. The fifth semiconductor device 246 and the sixth semiconductor device 250 are oriented in a same direction.

The attachment material 242 may be manifested by different materials at different stages of formation of the first multi-chip module 224 and the second multi-chip module 228. For example, at one stage, the attachment material 242 may be manifested as solder paste. At another stage, the attachment material 242 may be manifested as conductive adhesive. At a further stage, the attachment material 242 may be manifested as solder preforms. Other manifestations of the attachment material 242 are within the scope of the instant example.

The first connected clip set 208a is placed as a unit, with the connector bar 214a, so that the first clip 210a and the second clip 212a are concurrently placed on the seventh portion of the attachment material 242 on the fifth semiconductor device 246 and on the eighth portion of the attachment material 242 on the sixth semiconductor device 250, respectively.

Figure 2C:
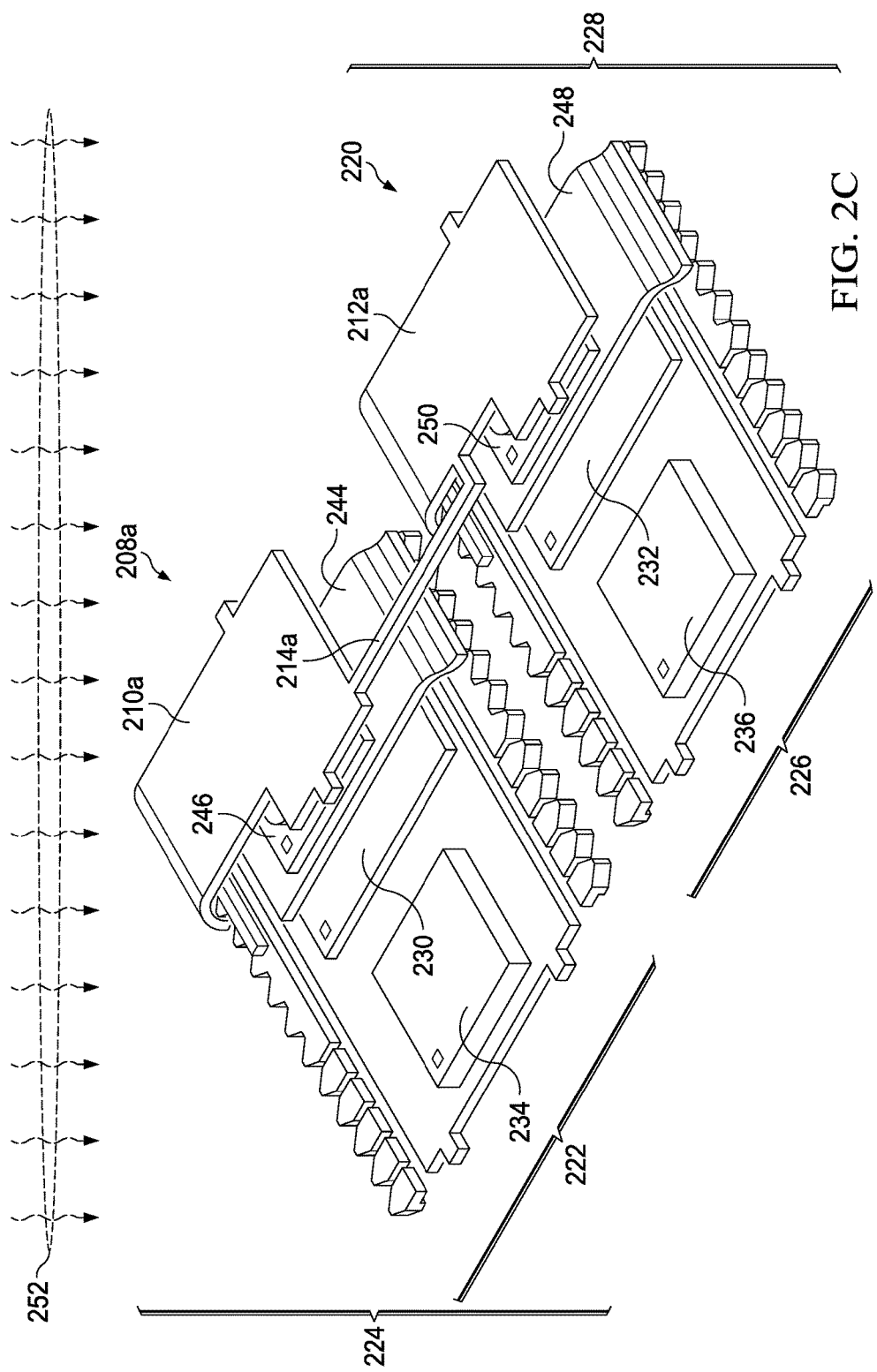

Referring to FIG. 2C, the lead frame array 220 is heated in a heating operation, for example by a radiant heat process 252, which may be a solder reflow operation and/or an adhesive curing operation. In the first multi-chip module 224, the attachment material 242 of FIG. 2B forms electrical connections between the first semiconductor device 230 and the first discrete clip 244, between the first discrete clip 244 and the fifth semiconductor device 246, and between the fifth semiconductor device 246 and the first clip 210a of the first connected clip set 208a. Similarly, in the second multi-chip module 228, the attachment material 242 forms electrical connections between the second semiconductor device 232 and the second discrete clip 248, between the second discrete clip 248 and the sixth semiconductor device 250, and between the sixth semiconductor device 250 and the second clip 212a of the first connected clip set 208a. The connector bar 214a may hold the first clip 210a and the second clip 212a in desired positions, advantageously preventing shifting or rotating of the first clip 210a and the second clip 212a and preventing distortion of the attachment material 242. As a further benefit, the first clip 210a and the second clip 212a being held in desired positions may advantageously reduce shift and/or rotation of the first discrete clip 244 and/or the second discrete clip 248 during the heating operation.

Figure 2D:
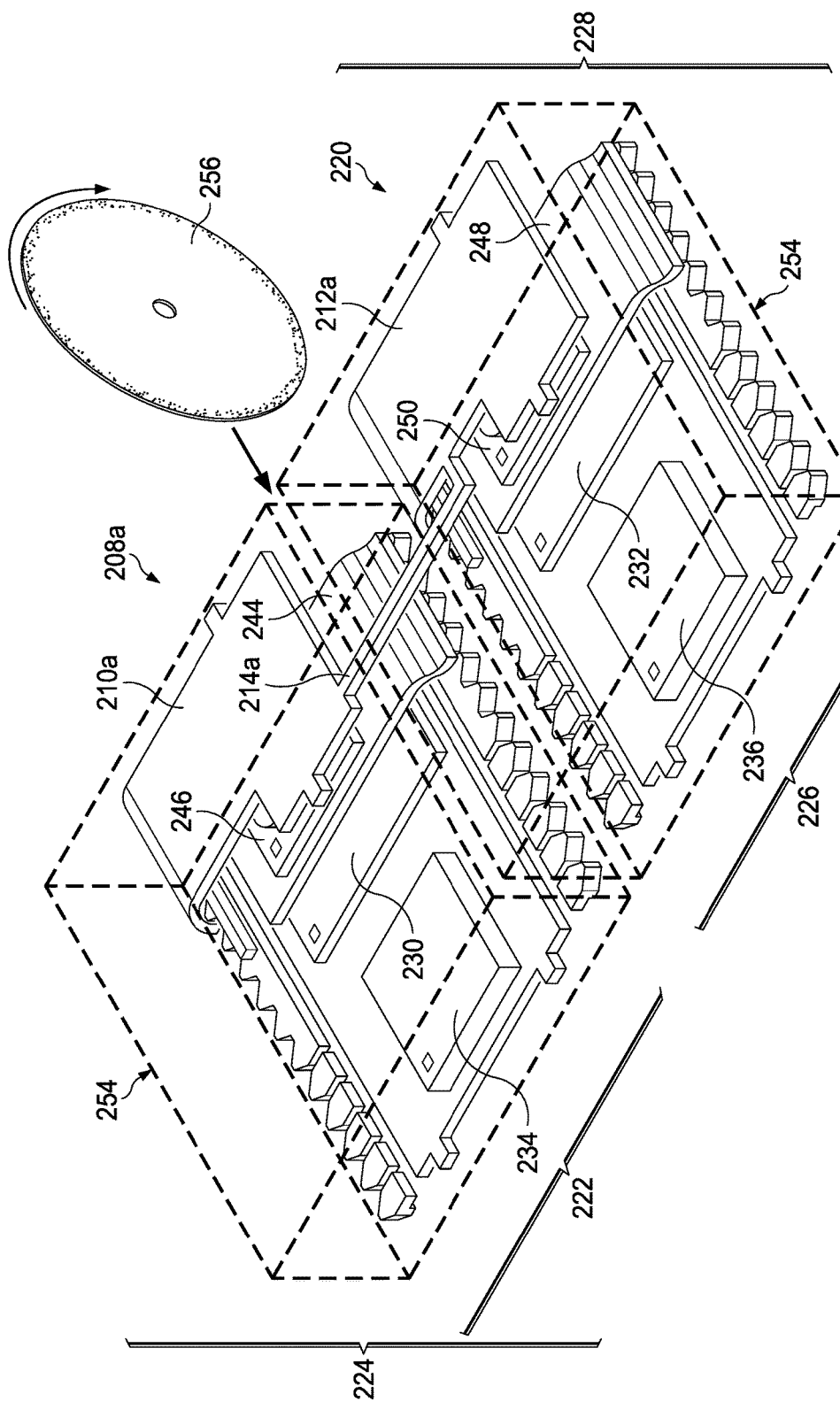

Referring to FIG. 2D, packaging material 254 is formed on the multi-chip modules on the lead frame array 220, including the first multi-chip module 224 and the second multi-chip module 228. The packaging material 254 may include, for example, encapsulation polymer material such as epoxy. The packaging material 254 may be formed so as to expose leads of the lead frame array 220 for each multi-chip module. A portion of one or more of the clips in the multi-chip modules may be exposed by the packaging material 254 to provide electrical or thermal access, for example for heatsink purposes. The packaging material 254 may optionally be formed so as to form an air cavity in the multi-chip modules. The connector bar 214a remains connecting the first clip 210a to the second clip 212a after the packaging material 254 is formed.

The multi-chip modules are singulated by a singulation process, for example a saw process as exemplified in FIG. 2D by a saw blade 256. The singulation process separates the first multi-chip module 224 from the second multi-chip module 228. The singulation process severs the connector bar 214a, leaving a severed cross section of the connector bar 214a exposed at a surface of the packaging material 254 in the first multi-chip module 224 and the second multi-chip module 228.

Figure 3:
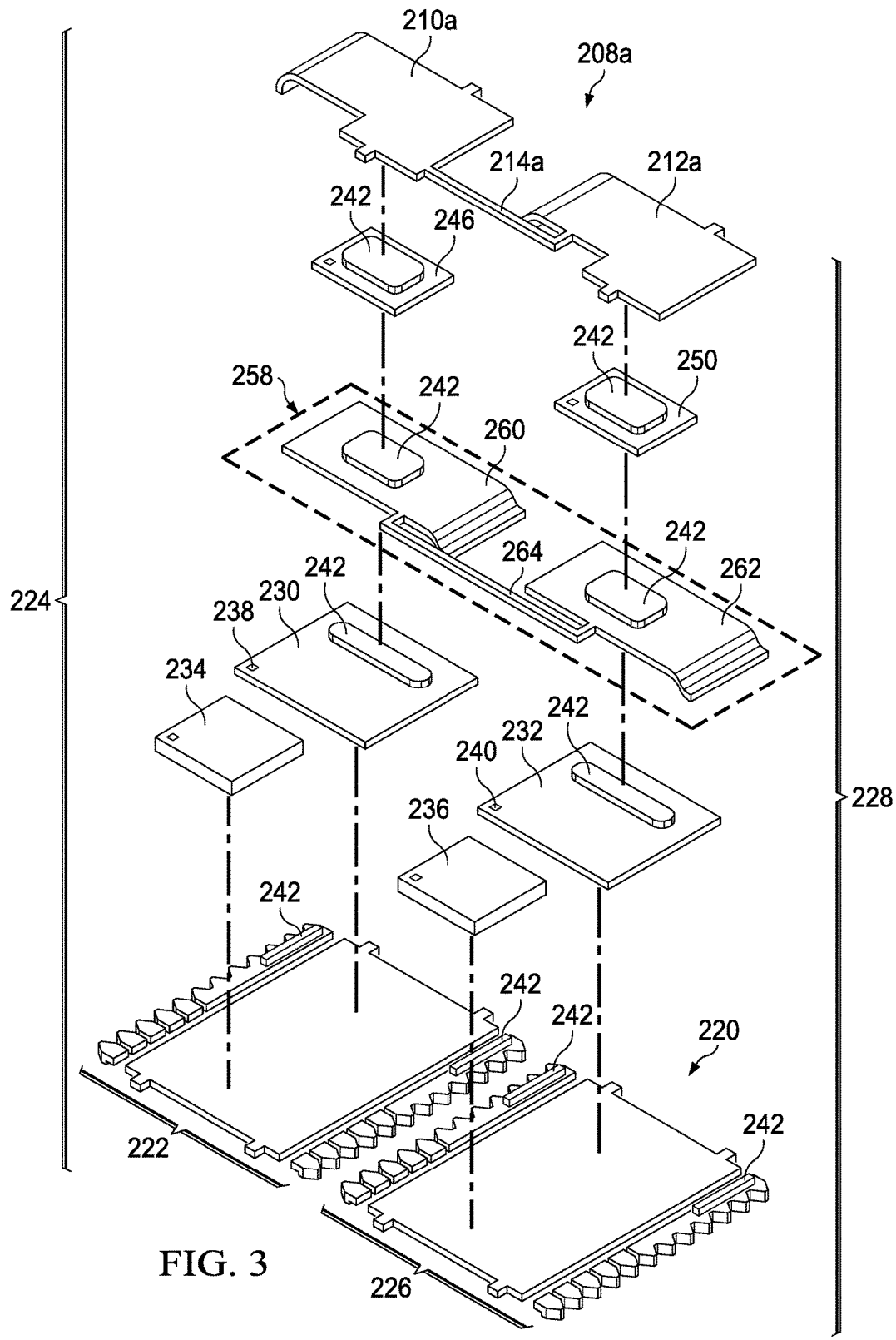
FIG. 3 is an exploded view of another version of the first multi-chip module and the second multi-chip module of FIG. 2B.

FIG. 3 is an exploded view of another version of the first multi-chip module 224 and the second multi-chip module 228 of FIG. 2B. In the instant example, the first discrete clip 244 and the second discrete clip 248 of FIG. 2B are replaced by a second connected clip set 258. The second connected clip set 258 includes a first clip 260 and a second clip 262, connected by a connector bar 264. The second connected clip set 258 is separated from a clip tape as a unit, similar to the first connected clip set 208a, and placed as a unit onto the first multi-chip module 224 and the second multi-chip module 228. The connector bar 264 remains in place during a heating operation, which may be a solder reflow operation and/or an adhesive curing operation. The connector bar 264 further remains in place during formation of packaging material, similarly to the connector bar 214a of the first connected clip set 208a. The connector bar 264 is severed during a singulation process, as is the connector bar 214a of the first connected clip set 208a.

Figure 4:
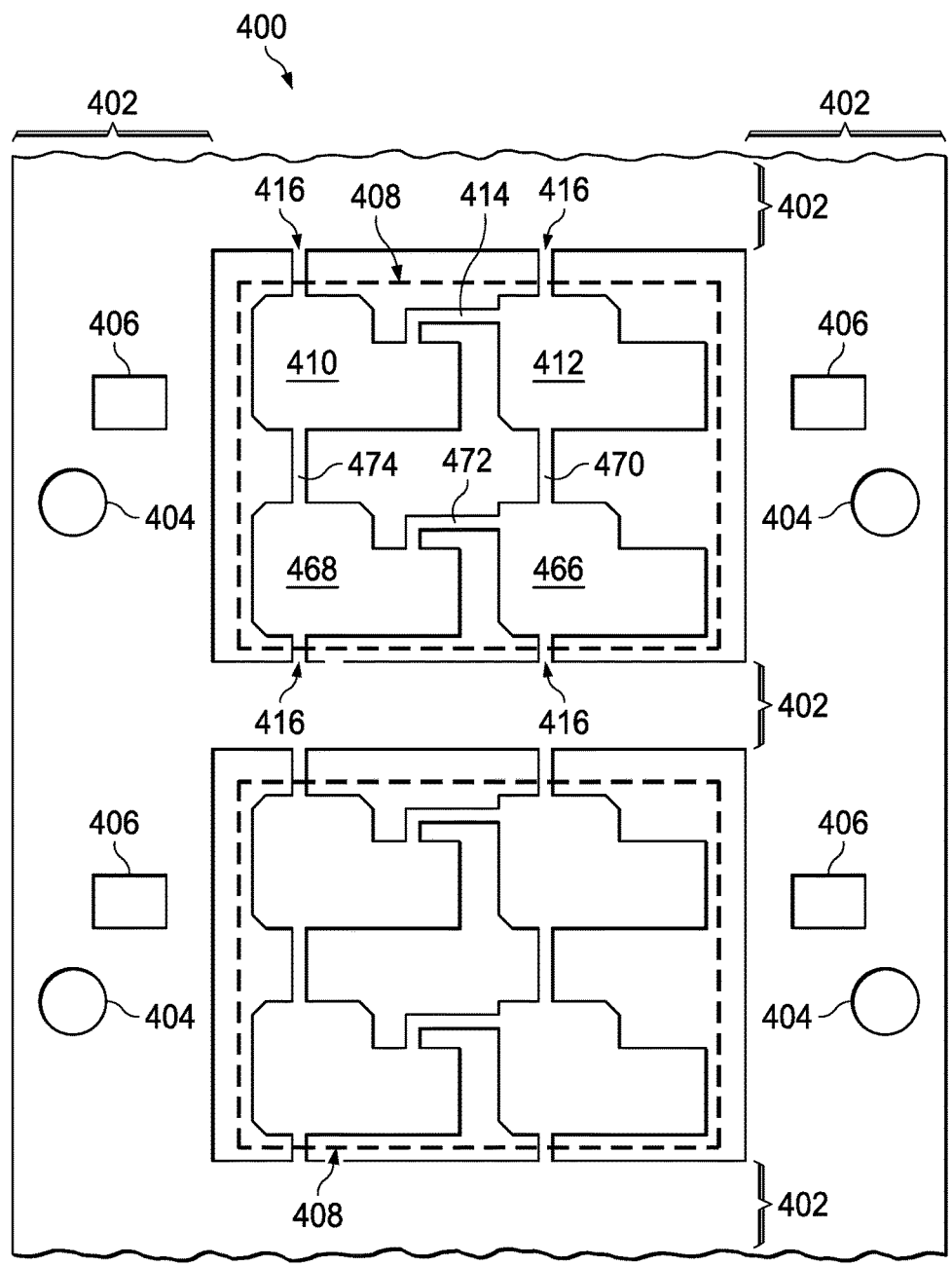
FIG. 4 depicts another example clip tape containing connected clip sets.

FIG. 4 depicts another example clip tape containing connected clip sets. The clip tape 400 has a tape frame 402 which extends along sides of the clip tape 400, possibly with sprocket holes 404 and/or registration apertures 406. The clip tape 400 includes a plurality of connected clip sets 408, separated by portions of the tape frame 402. In the instant example, each connected clip set 408 includes a first clip 410, a second clip 412, a third clip 466 and a fourth clip 468. The first clip 410, a second clip 412, a third clip 466 and a fourth clip 468 are connected by connector bars, for example a first connector bar 414 which connects the first clip 410 and the second clip 412, a second connector bar 470 which connects the second clip 412 and the third clip 466, a third connector bar 472 which connects the third clip 466 and the fourth clip 468, and a fourth connector bar 474 which connects the fourth clip 468 and the first clip 410. The connector bars 414, 470, 472 and 474 do not extend to the tape frame 402. Tie bars 416 connect the first clip 410, the second clip 412, the third clip 466 and the fourth clip 468 to the tape frame 402. The clip tape 400 may be formed, for example, of metal foil by a stamping process and possibly a subsequent coining process.

Each connected clip set 408 is separated from the clip tape 400 as a unit, wherein the clips 410, 412, 466 and 468 remain connected together by the connector bars 414, 470, 472 and 474. Each connected clip set 408 may be separated from the clip tape 400 by a punch process, for example.

Figures 5A, 5B:
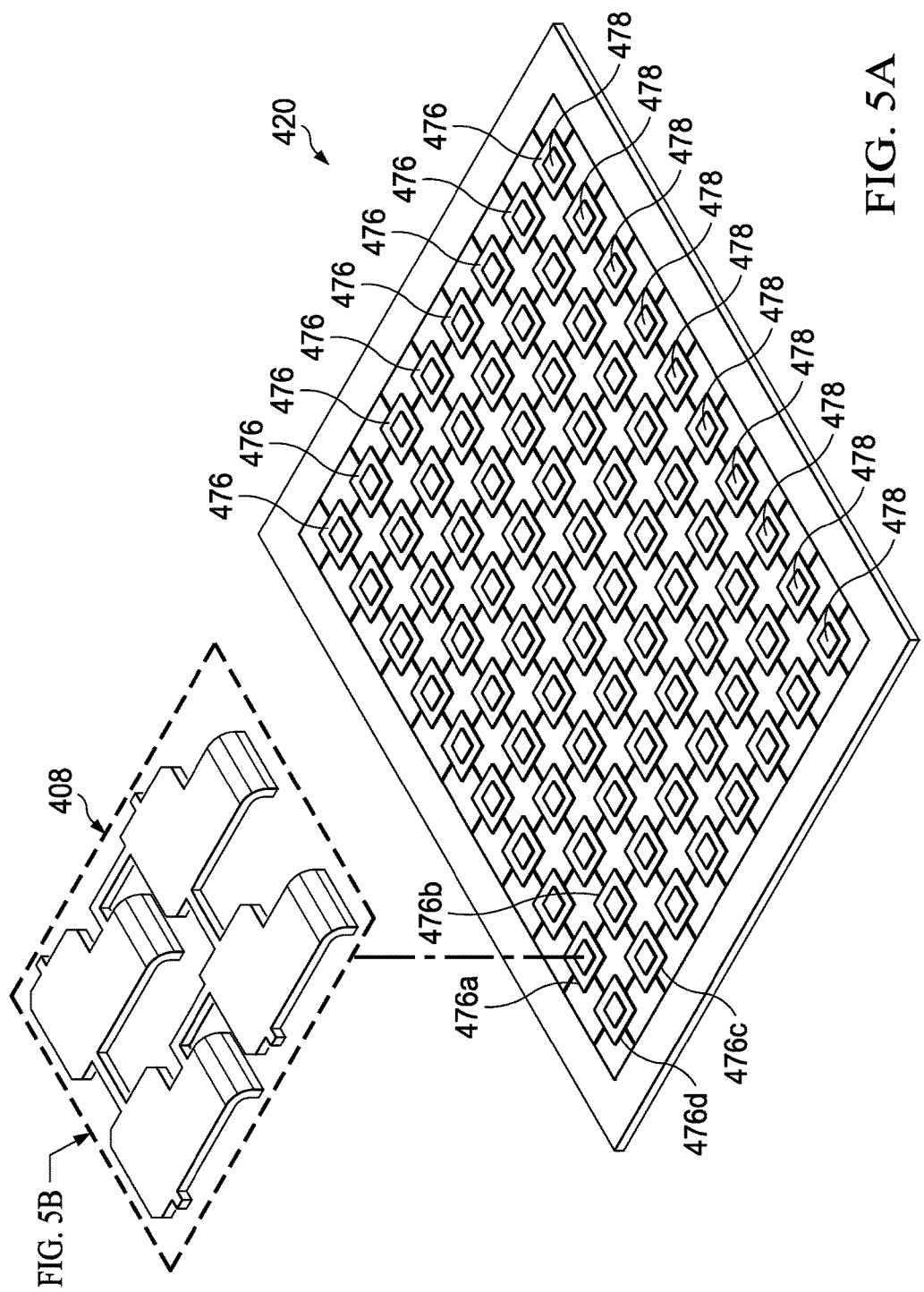
FIG. 5A and FIG. 5B depict a connected clip set of FIG. 4 being placed onto a lead frame array.
Figure 5B:
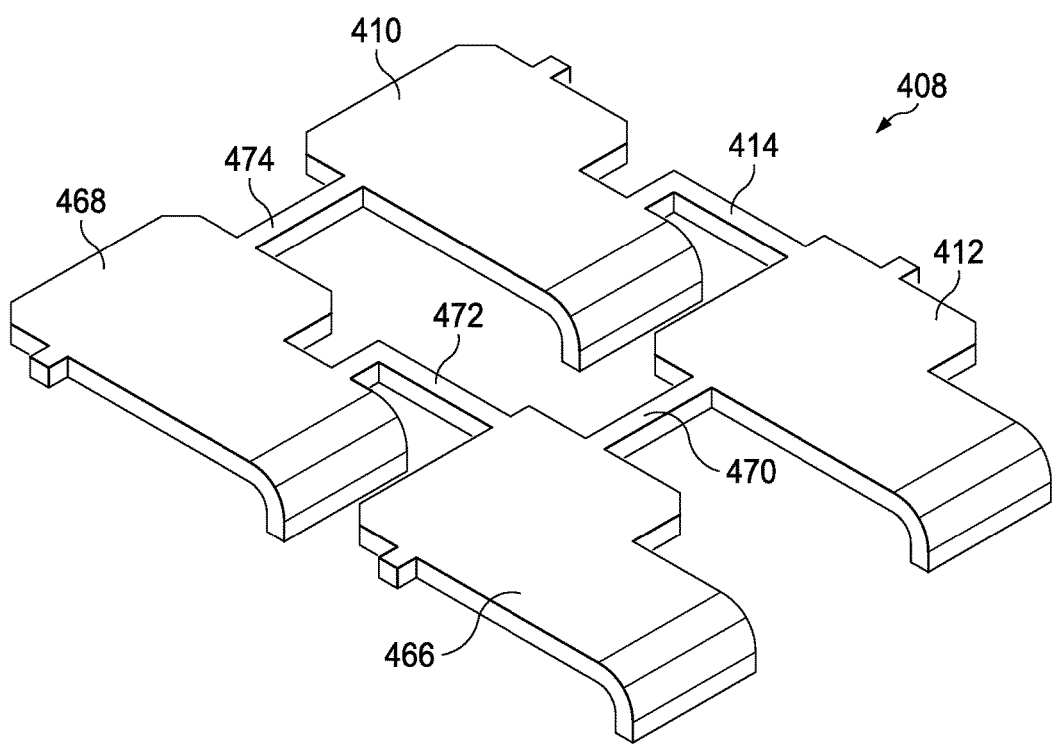

FIG. 5A and FIG. 5B depict a connected clip set 408 of FIG. 4 being placed onto a lead frame array. Referring to FIG. 5A, the lead frame array 420 includes a plurality of lead frame units 476, including a first lead frame unit 476a, a second lead frame unit 476b, a third lead frame unit 476c and a fourth lead frame unit 476d. Semiconductor devices 478 are placed onto the lead frame units 476. Attachment material, not shown, is disposed on the semiconductor devices 478.

The connected clip set 408 is placed as a unit onto the lead frame array 420, so that the first clip 410 is placed onto the attachment material on the first lead frame unit 476a, the second clip 412 is placed onto the attachment material on the second lead frame unit 476b, the third clip 466 is placed onto the attachment material on the third lead frame unit 476c, and the fourth clip 468 is placed onto the attachment material on the fourth lead frame unit 476d. The connected clip set 408 is shown in detail in FIG. 5B. The first clip 410, the second clip 412, the third clip 466, and the fourth clip 468 remain connected by the first connector bar 414, the second connector bar 470, the third connector bar 472 and the fourth connector bar 474.

Additional instances of the connected clip set 408 are placed onto the remaining lead frame units 476. Additional semiconductor devices, attachment material and clips may be placed onto the lead frame units 476. The lead frame array 420 is subsequently heated in a heating operation, in which the clips 410, 412, 466 and 468 are electrically connected to the respective semiconductor devices 478 by the attachment material, while remaining connected by the connector bars 414, 470, 472 and 474. The connector bars 414, 470, 472 and 474 are subsequently severed, for example during a singulation process which separates the lead frame units 476.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A clip tape, comprising:
a plurality of connected clip sets, wherein each connected clip set comprises:
a first clip;
a second clip oriented in a same direction as the first clip; and
a connector bar, the connector bar connecting the first clip to the second clip; and
a tape frame extending along sides of the clip tape; wherein:
each first clip is connected to the tape frame by at least one tie bar;
each second clip is connected to the tape frame by at least one tie bar;
the connector bar does not extend to the tape frame; and
the tape frame, each first clip, each second clip, each connector bar, and each tie bar comprise a same metal.

2. The clip tape of claim 1, wherein the tape frame, the first clips, the second clips, the connector bars and the tie bars have thicknesses that are equal to each other within a few micrometers.

3. The clip tape of claim 1, wherein the tape frame, the first clips, the second clips, the connector bars and the tie bars comprise a copper foil.

4. The clip tape of claim 1, wherein the connector bars have a width of 0.20 millimeters to 0.30 millimeters.

5. The clip tape of claim 1, wherein each connected clip set has exactly one connector bar connecting the first clip of the connected clip set to the corresponding second clip of the connected clip set.

6. A multi-chip module, comprising:
 a lead frame unit;
 a semiconductor device attached to the lead frame unit;
 a clip of a connected clip set, the clip being attached to the semiconductor device by an electrically conductive attachment material; and
 a packaging material on the clip, the semiconductor device and the lead frame unit;
 wherein:
  the clip comprises at least one tie bar extending past the semiconductor device, the tie bar being covered by the packaging material; and
  the clip comprises exactly one portion of a connector bar which extends to a surface of the packaging material.

7. The multi-chip module of claim 6, wherein the packaging material comprises a polymer encapsulant material.

8. The multi-chip module of claim 6, wherein the clip and the connector bar comprise a copper foil.

9. The multi-chip module of claim 6, wherein the connector bar has a width of 0.20 mm to 0.30 mm.

10. The multi-chip module of claim 6, wherein the clip includes a contact foot extending out of the plane of the clip.

11. The multi-chip module of claim 6, further including a discrete clip located between the clip and the lead frame unit.

* * * * *